(12) United States Patent
Park et al.

(10) Patent No.: US 6,781,320 B2
(45) Date of Patent: Aug. 24, 2004

(54) ACTIVE MATRIX ORGANIC ELECTROLUMINESCENCE DISPLAY DEVICE

(75) Inventors: Jae-Yong Park, Anyang-si (KR); Tae-Joon Ahn, Seoul (KR)

(73) Assignee: LG. Philips LCD Co., Ltd., Seoul (KR)

(*) Notice: Subject to any disclaimer, the term of this patent is extended or adjusted under 35 U.S.C. 154(b) by 6 days.

(21) Appl. No.: 10/327,088

(22) Filed: Dec. 24, 2002

(65) Prior Publication Data

US 2003/0137255 A1 Jul. 24, 2003

(30) Foreign Application Priority Data

Dec. 28, 2001 (KR) .............................. 10-2001-0087390

(51) Int. Cl.[7] .............................................. G09G 3/10
(52) U.S. Cl. .............................. 315/169.1; 315/169.3; 345/82; 345/84; 345/92
(58) Field of Search .......................... 315/169.3, 169.1, 315/169.2; 345/76, 77, 82, 84, 92; 257/72

(56) References Cited

U.S. PATENT DOCUMENTS

| | | | |
|---|---|---|---|
| 5,684,365 A | * | 11/1997 | Tang et al. .............. 315/169.3 |
| 6,114,715 A | * | 9/2000 | Hamada ..................... 257/72 |
| 6,229,508 B1 | * | 5/2001 | Kane ........................... 345/82 |
| 6,351,078 B1 | * | 2/2002 | Wang et al. .............. 315/169.3 |
| 6,515,428 B1 | * | 2/2003 | Yeh et al. ................. 315/169.3 |
| 6,580,408 B1 | * | 6/2003 | Bae et al. ..................... 345/76 |
| 6,583,576 B2 | * | 6/2003 | Koyama ................. 315/169.2 |
| 6,611,108 B2 | * | 8/2003 | Kimura .................... 315/169.3 |

* cited by examiner

Primary Examiner—Haissa Philogene
(74) Attorney, Agent, or Firm—McKenna Long & Aldridge LLP (57) ABSTRACT

An active matrix organic electroluminescence display device includes a substrate, a gate line on the substrate, a data line crossing the gate line, a power line on the substrate, a first switching thin film transistor electrically connected to the gate line and the data line, a first driving thin film transistor electrically connected to the first switching thin film transistor and the power line, a storage capacitor electrically connected to the first switching thin film transistor, the first driving thin film transistor and the power line, and an electroluminescent diode electrically connected to the first driving thin film transistor, wherein the electroluminescent diode includes a first electrode and a second electrode over the first electrode, and the first electrode covers the storage capacitor.

20 Claims, 7 Drawing Sheets

ACTIVE MATRIX ORGANIC ELECTROLUMINESCENCE DISPLAY DEVICE

The present invention claims the benefit of Korean Patent Application No. 2001-87390 filed in Korea on Dec. 28, 2001, which is hereby incorporated by reference for all purposes as if fully set forth herein.

BACKGROUND OF THE INVENTION

1. Field of the Invention

The present invention relates to an active matrix organic electroluminescence display device including an organic emissive layer.

2. Discussion of the Related Art

A cathode ray tube is widely used as a display device such as a television and a monitor, and the cathode ray tube has a large size, heavy weight, and high driving voltage. Therefore, flat panel displays, which have properties of being thin, low weight and low power consumption, have been proposed. The flat panel displays include a liquid crystal display device, a plasma display panel, a field emission display device, and an electroluminescence display device.

Electroluminescence display devices may be categorized into inorganic electroluminescence display devices and organic electroluminescence display devices according to source material for exciting carriers. The organic electroluminescence display device has attracted considerable attention lately due to its high brightness, low driving voltage, and natural color images from all colors of a visible light spectrum. Additionally, the organic electroluminescence display device has great contrast ratio because of self-luminescence. The organic electroluminescence display device can easily display moving images due to short response time of several microseconds, and is not limited by a viewing angle. The organic electroluminescence display device is stable at a low temperature, and its driving circuit can be fabricated easily because it is driven by low voltage. Besides, manufacturing process of the organic electroluminescence display device is relatively simple.

In general, an organic electroluminescence display device emits light by injecting an electron from a cathode electrode and a hole from an anode electrode into an emissive layer, combining the electron with the hole, which generates an exciton, and transiting the exciton from an excited state to a ground state.

Because of its luminous mechanism similar to a light emitting diode, the organic electroluminescence display device may be called an organic light emitting diode (OLED).

Organic electroluminescence display devices are classified into a passive matrix type and an active matrix type according to a driving method.

The passive matrix organic electroluminescence display device has a simple structure and is manufactured through a simple process. However, the passive matrix organic electroluminescence display device has high power consumption and is difficult to manufacture to have a large area. Additionally, aperture ratio in the passive matrix organic electroluminescence display device decreases according to the increasing number of electro lines.

Therefore, the passive matrix organic electroluminescence display device is widely used as a small size display device. On the other hand, the active matrix organic electroluminescence display (AMOELD) device is widely used as a large size display device.

An active matrix organic electroluminescence display (AMOELD) device according to the related art will be described hereinafter more in detail.

Figure 1:
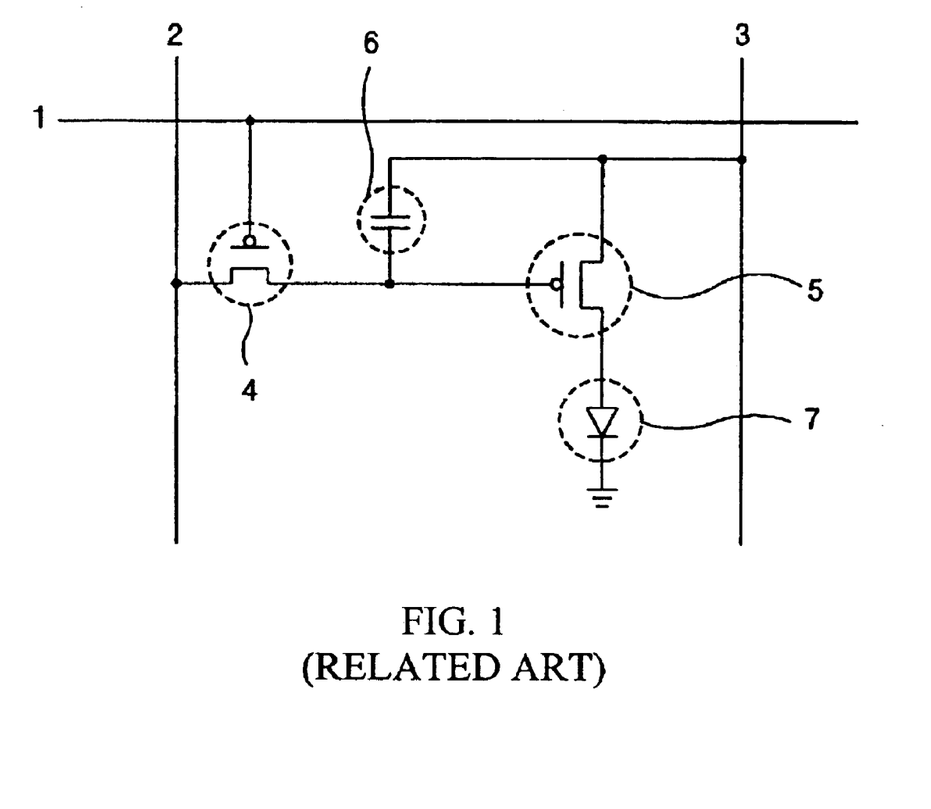
FIG. 1 is an equivalent circuit diagram for a pixel of an active matrix organic electroluminescence display device in the related art.

FIG. 1 is an equivalent circuit diagram for a pixel of an AMOELD device in the related art. In FIG. 1, a pixel of an AMOELD device includes a switching thin film transistor (TFT) 4, a driving thin film transistor (TFT) 5, a storage capacitor 6, and an electroluminescent diode 7.

A gate electrode of the switching TFT 4 is electrically connected to a gate line 1, and a source electrode of the switching TFT 4 is electrically connected to a data line 2. A drain electrode of the switching TFT 4 is electrically connected to a gate electrode of the driving TFT 5. A drain electrode of the driving TFT 5 is electrically connected to an anode electrode of the electroluminescent diode 7, and a source, electrode of the driving TFT 5 is electrically connected to a power line 3. A cathode electrode of the electroluminescent diode 7 is grounded. The storage capacitor 6 is electrically connected to the gate electrode and the source electrode of the driving TFT 5.

When a signal is applied to the gate electrode of the switching TFT 4 through the gate line 1, the switching TFT 4 turns on. At this time, a signal from the data line 2 is transmitted to the gate electrode of the driving TFT 5 through the switching TFT 4 and is stored in the storage capacitor 6. Then, the driving TFT 5 is turned on by the signal from the data line 2, and a signal from the power line 3 is transmitted to the electroluminescent diode 7 through the driving TFT 5. Therefore, light is emitted from the electroluminescent diode 7. Brightness of the device of FIG. 1 is regulated by controlling current passing through the electroluminescent diode 7.

Here, even though the switching TFT 4 turns off, the driving TFT 5 maintains in an "on state" because of the signal stored in the storage capacitor 6. Accordingly, light is emitted by current continuously passing through the electroluminescent diode 7 until the next signal is transmitted to the gate electrode of the driving TFT 5 through the switching TFT 4.

Figure 2:
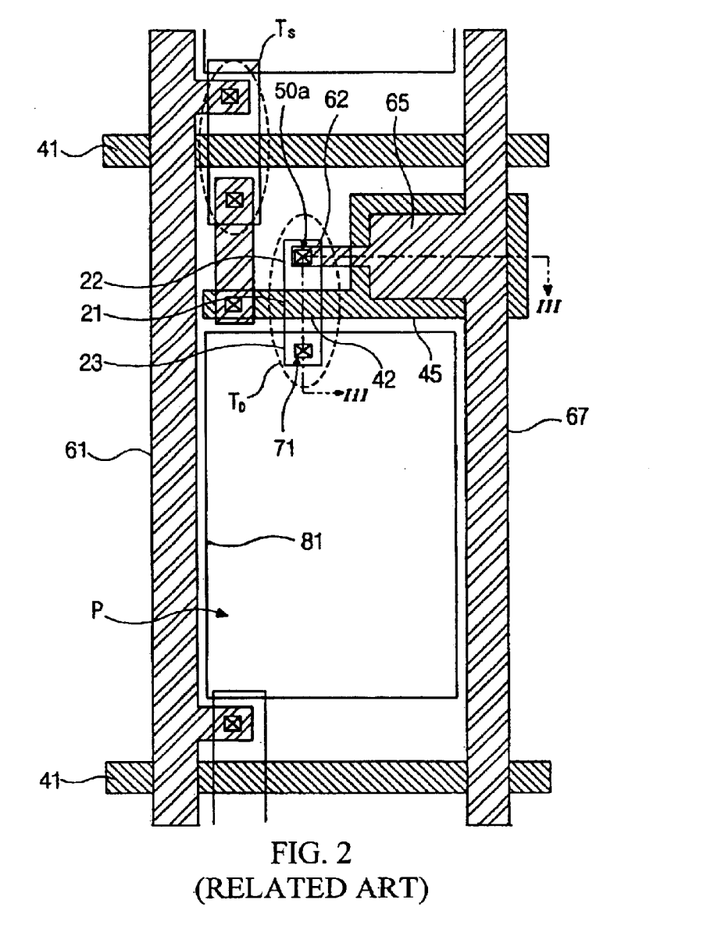
FIG. 2 is a plan view for a pixel of an active matrix organic electroluminescence display device in the related art.

FIG. 2 illustrates a plan view for the pixel of an AMOELD device in the related art. In FIG. 2, a gate line 41 and a data line 61 cross each other and define a pixel region "P". A power line 67 is formed parallel to the data line 61.

A switching TFT "$T_S$" is formed at the crossing of the gate line 41 and the data line 61 and is connected to the gate line 41 and the data line 61. A driving TFT "$T_D$" is formed in the pixel region "P" and is connected to the switching TFT "$T_S$".

As stated above, the gate electrode 42 of the driving TFT "$T_D$" is connected to the drain electrode of the switching TFT "$T_S$" and a first capacitor electrode 45 of the storage capacitor. The source electrode 62 of the driving TFT "$T_D$" is connected to the source region 22 through a first contact hole 50a. The source electrode 62 is also connected to the second capacitor electrode 65 of the storage capacitor, and the second capacitor electrode 65 is connected to the power line 67. The second capacitor electrode 65 forms the storage capacitor with the overlapped first capacitor electrode 45. A drain region 23 of the driving TFT "$T_D$" overlaps a pixel electrode 81 formed in the pixel region "P", and the drain region 23 is connected to the pixel electrode 81 through a second contact hole 50b.

Figure 3:
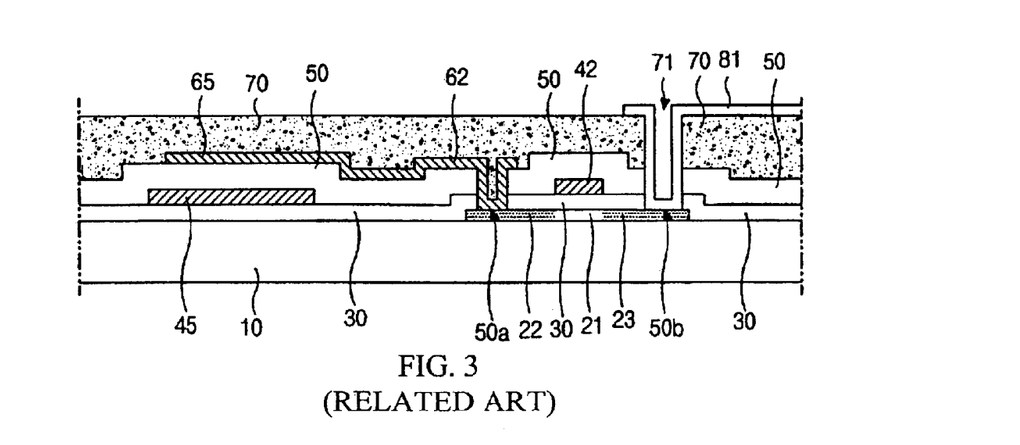
FIG. 3 is a cross-sectional view along the line III—III of FIG. 2.

FIG. 3 illustrates a cross-section along the line III—III of FIG. 2. In FIG. 3, polycrystalline silicon layers 21, 22 and 23 having an island shape are formed on a substrate 10, and the polycrystalline silicon layers are divided into an active layer 21 and source and drain regions 22 and 23. The source and drain regions 22 and 23 are doped.

A gate insulator 30 is formed on the polycrystalline silicon layers 21, 22 and 23, and a gate electrode 42 and a first capacitor electrode 45 are formed on the gate insulator 30. The gate electrode 42 is disposed over the active layer 21.

An interlayer dielectric 50 is formed on the gate electrode 42 and the first capacitor electrode 45, and the interlayer dielectric 50 has first and second contact holes 50a and 50b, which also pass through the gate insulator 30, to expose the source and drain regions 22 and 23, respectively.

A source electrode 62 and a second capacitor electrode 65 are formed on the interlayer dielectric 50. The source electrode 62 and the second capacitor electrode 65 are made of a conductive material such as metal. The source electrode 62 is connected to the source region 22 through the first contact hole 50a. The second capacitor electrode 65 contacts the source electrode 62, and overlaps the first capacitor electrode 45 to form a storage capacitor.

Next, a passivation layer 70 is formed on the source electrode 62 and the second capacitor electrode 65. The passivation layer 70 has a third contact hole 71 over the second contact hole 50b.

A pixel electrode 81 is formed on the passivation layer 70, and the pixel electrode 81 is connected to the drain region 23 through the third and second contact holes 71 and 50b. The pixel electrode 81 is an anode electrode of an electroluminescent diode and is made of a transparent conductive material.

Figure 4:
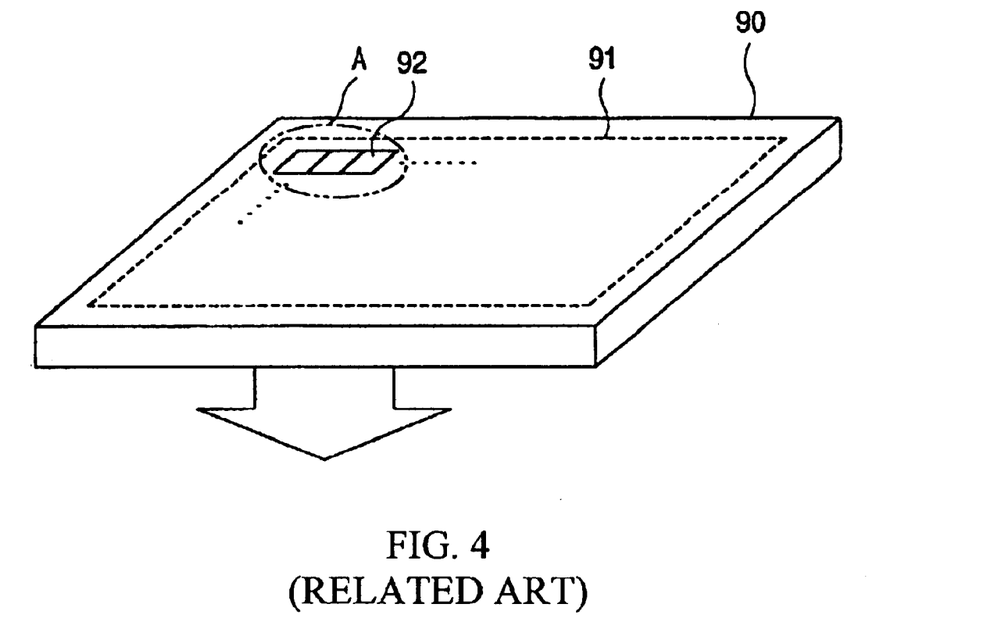
FIG. 4 is a schematic view showing an active matrix organic electroluminescence display device of a bottom emission mode in the related art.

Although not shown in the figure, an emissive layer and a cathode electrode of the electroluminescent diode are subsequently formed on the pixel electrode 81 in the AMOELD device. An opaque material is widely used as the cathode electrode. Therefore, as shown in FIG. 4, the AMOELD device in the related art is a bottom emission mode. At this time, a plurality of pixels 92 are formed in an image area 91 on an upper side of a substrate 90, which corresponds to the substrate 10 of FIG. 3. Here, an aperture ratio of the device is decreased because light passes through the only region that does not have the thin film transistors, that is, the switching TFT and the driving TFT, and the storage capacitor.

Figure 5:
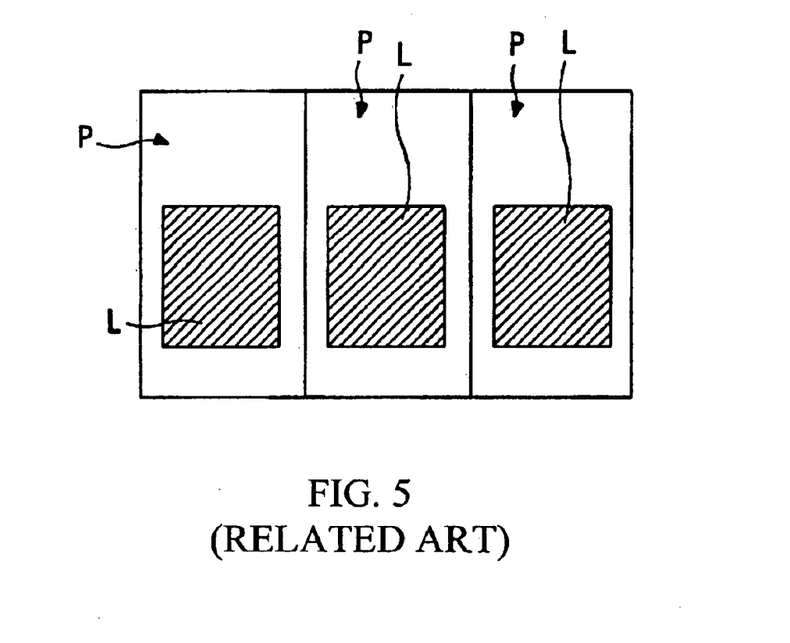
FIG. 5 is a view illustrating a region where light is emitted.

FIG. 5 shows a region through which light passes and corresponds to the region "A" of FIG. 4. In FIG. 5, light is emitted in the only the hatched region "L" of the pixel region "P". Therefore, image quality is reduced because of the low aperture ratio, and more current is required in order to display bright images. The lifetime of the device may become short because of the application of increased current.

SUMMARY OF THE INVENTION

Accordingly, the present invention is directed to an active matrix organic electroluminescence display device that substantially obviates one or more of problems due to limitations and disadvantages of the related art.

An advantage of the present invention is to provide an active matrix organic electroluminescence display device that has a high aperture ratio and long lifetime.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescence display device includes a substrate, a gate line on the substrate, a data line crossing the gate line, a power line on the substrate, a first switching thin film transistor electrically connected to the gate line and the data line, a first driving thin film transistor electrically connected to the first switching thin film transistor and the power line, a storage capacitor electrically connected to the first switching thin film transistor, the first driving thin film transistor and the power line, and an electroluminescent diode electrically connected to the first driving thin film transistor, wherein the electroluminescent diode includes a first electrode and a second electrode over the first electrode, and the first electrode covers the storage capacitor.

The active matrix organic electroluminescence display device may further include a second switching thin film transistor and a second driving thin film transistor, wherein the second switching thin film transistor is electrically connected to the gate line, the data line and the first switching thin film transistor, and the second driving thin film transistor is electrically connected to the first switching thin film transistor, the first driving thin film transistor and the storage capacitor.

In another aspect, an active matrix organic electroluminescence display device includes a substrate, a gate line on the substrate, a data line crossing the gate line, a power line on the substrate, a plurality of thin film transistors electrically connected to the gate line and the data line, a storage capacitor electrically connected to the plurality of thin film transistors and the power line, and an electroluminescent diode electrically connected to the plurality of thin film transistors, wherein the electroluminescent diode includes a first electrode and a second electrode over the first electrode, and the first electrode covers the storage capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, which are illustrated in the accompanying drawings.

Figure 6:
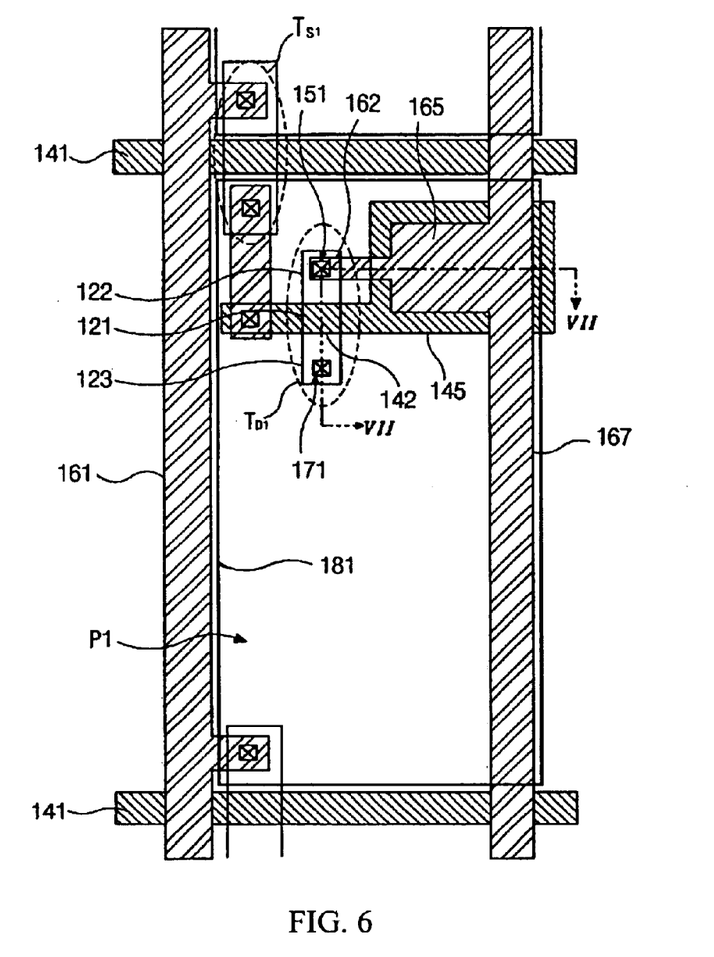
FIG. 6 is a plan view of an active matrix organic electroluminescence display device according to a first embodiment of the present invention.

FIG. 6 is a plan view of an active matrix organic electroluminescence display (AMOELD) device according to a first embodiment of the present invention. In FIG. 6, a gate line 141 is formed horizontally in the context of the figure and a data line 161 is formed vertically in the context of the figure. The gate line 141 and the data line 161 cross each other and defines a pixel region "P1". A power line 167 is formed parallel to the data line 161.

A switching thin film transistor (TFT) "$T_{S1}$" is formed at the crossing of the gate line 141 and data line 161 and is connected to the gate line 141 and the data line 161. A part of the gate line 141 is a gate electrode of the switching TFT "$T_{S1}$".

A driving thin film transistor (TFT) "$T_{D1}$" is formed in the pixel region "P1". A gate electrode 142 of the driving TFT "$T_{D1}$" is connected to a drain electrode of the switching TFT "$T_{S1}$" and a first capacitor electrode 145. A source electrode 162 of the driving TFT "$T_{D1}$" overlaps a source region 122 of doped polycrystalline silicon and contacts the source region 122 through a first contact hole 151. The source electrode 162 of the driving TFT "$T_{D1}$" is also connected to a second capacitor electrode 165. The second capacitor electrode 165 is connected to the power line 167 and overlaps the first capacitor electrode 145 to form a storage capacitor.

A pixel electrode 181 is formed in the pixel region "P1". The pixel electrode 181 covers the switching TFT "$T_{S1}$", the driving TFT "$T_{D1}$", the storage capacitor, and a portion of the power line 167. The pixel electrode 181 overlaps the drain region 123 of the driving TFT "$T_{D1}$" and is connected to the drain region 123 through a second contact hole 171.

Figure 7:
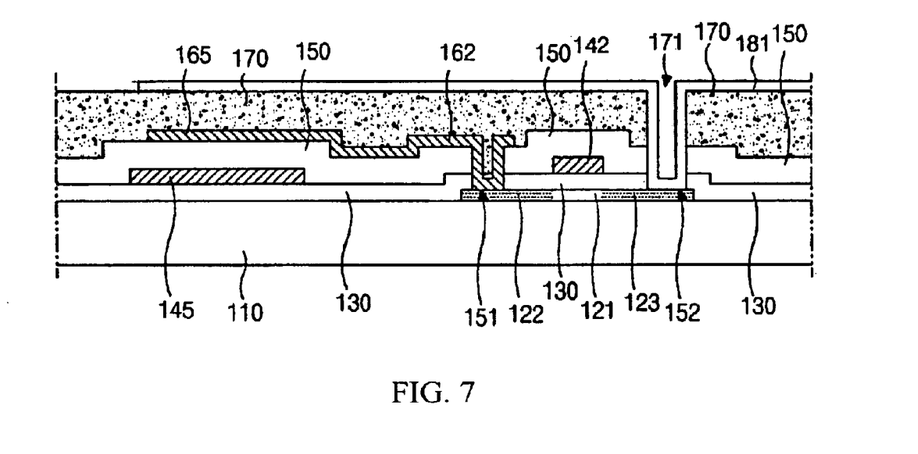
FIG. 7 is a cross-sectional view along the line VII—VII of FIG. 6.

FIG. 7 is a cross-sectional view of an active matrix organic electroluminescence display (AMOELD) device according to the embodiment of the present invention, and corresponds to a cross-section along the line VII—VII of FIG. 6.

In FIG. 7, polycrystalline silicon layers 121, 122 and 123 of an island shape are formed on a substrate 110. The polycrystalline silicon layers are divided into an active layer 121 and source and drain regions 122 and 123. The source and drain regions 122 and 123 includes dopants. Here, a buffer layer (not shown) may be formed between the substrate 110 and the polycrystalline silicon layers 121, 122 and 123.

A gate insulator 130 is formed on the polycrystalline silicon layers 121, 122 and 123. A gate electrode 142 and a first capacitor electrode 145 are formed on the gate insulator 130. The gate electrode 142 is disposed over the active layer 121, and the gate electrode 142 is connected to the first capacitor electrode 145.

An interlayer dielectric 150 is formed on the gate electrode 142 and the first capacitor electrode 145. The interlayer dielectric 150 is made of silicon oxide and has first and second contact holes 151 and 152, which also pass through the gate insulator 130 to expose the source and drain regions 122 and 123, respectively.

Next, a source electrode 162 and a second capacitor electrode 165 connected to the source electrode 162 are formed on the interlayer dielectric 150. The source electrode 162 is connected to the source region 122 through the first contact hole 151, and the second capacitor electrode 165 overlaps the first capacitor electrode 145 to form a storage capacitor.

A passivation layer 170 is formed on the source electrode 162 and the second capacitor electrode 165. The passivation layer 170 has a third contact hole 171 over the second contact hole 152.

A pixel electrode 181 is formed on the passivation layer 170 and is connected to the drain region 123 through the third and second contact holes 171 and 152. The pixel electrode 181 is an anode electrode of an electroluminescent diode. Here, the pixel electrode 181 is made of an opaque conductive material and covers the second capacitor electrode 165.

On the other hand, though not shown in the figure, a drain electrode, which is made of the same material as the source electrode 162, may be formed between the pixel electrode 181 and the drain region 123.

Additionally, an emissive layer (not shown) and a cathode electrode (not shown) are subsequently formed on the pixel electrode 181. The cathode electrode is made of a transparent conductive material.

Figure 8:
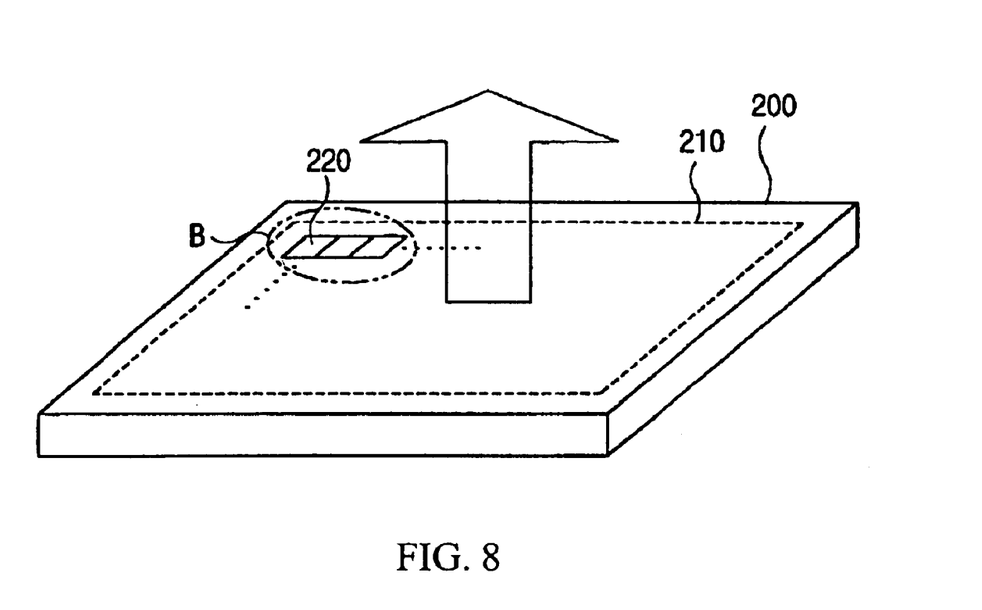
FIG. 8 is a schematic view illustrating an active matrix organic electroluminescence display device of a top emission mode according to the present invention.

FIG. 8 shows a schematic view for an AMOELD device of a top emission mode according to the present invention. In FIG. 8, a plurality of pixels 220, which have the structure shown in FIGS. 6 and 7, are formed in an image region 210 on an upper side of a substrate 200. As stated above, the pixel electrode 181 of FIG. 7, which is an anode electrode of an electroluminescent diode, is opaque and the cathode electrode, which is disposed over the pixel electrode 181, is transparent. Therefore, the AMOELD device of the present invention is top emission mode in which light is emitted toward the upper side of the substrate 200. At this time, since the pixel electrode 181 covers the switching TFT "$T_{S1}$", the driving TFT "$T_{D1}$", the storage capacitor, and a portion of the power line 181 of FIG. 6, the region that emits light increases.

Figure 9:
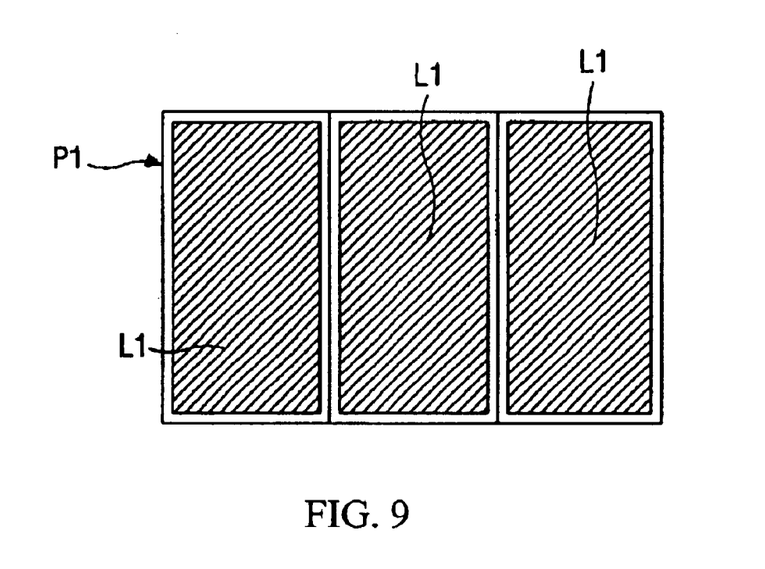
FIG. 9 is a showing a region where light is emitted.

FIG. 9 shows a region where light is emitted. In FIG. 9, the region "L1", where light is emitted, and the pixel region "P1" are nearly equal in size. Accordingly, aperture ratio increases, and lifetime of the AMOELD device is long because bright images can be displayed with low current.

Figure 10:
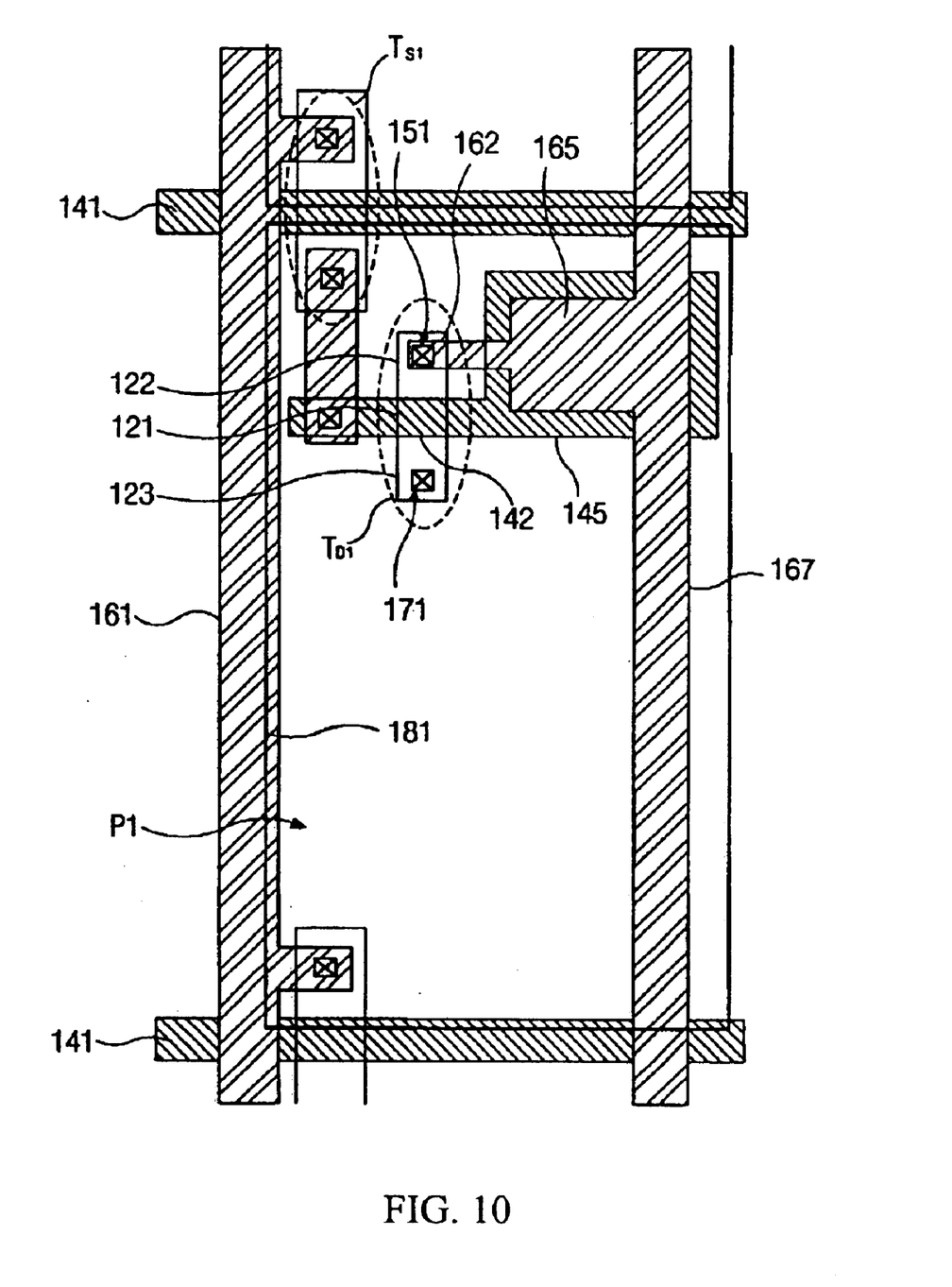
FIG. 10 illustrates a cross-sectional view of an active matrix organic electroluminescence display device according to a second embodiment of the present invention.

FIG. 10 shows a cross-sectional view of an AMOELD device according to a second embodiment of the present invention. The second embodiment of the present invention has the same structure as the first embodiment except for the pixel electrode. Thus the same symbol used in FIG. 6 is given to the same part as the first embodiment of FIG. 6, and explanation of the same parts is omitted.

In FIG. 10, the pixel electrode 181 covers the switching TFT "$T_{S1}$", the driving TFT "$T_{D1}$", the storage capacitor formed by the first and second capacitor electrodes 145 and 165, and a portion of the power line 167 like the first embodiment. Moreover, the pixel electrode 181 overlaps a portion of the gate line 141 and a portion of the data line 161. The pixel electrode 181 is an anode electrode of an electroluminescent diode and is made of an opaque conductive material. Although not shown in the figure, an emissive layer and a cathode electrode are subsequently formed on the pixel electrode 181.

The pixel electrode 181 of the second embodiment has a larger area than the first embodiment. Therefore, an aperture ratio increases even more.

In the first and second embodiments of the present invention, although the pixel includes two TFTs, that is, the switching TFT and the driving TFT, the pixel may includes four TFTs to increase uniformity of images.

Figure 11:
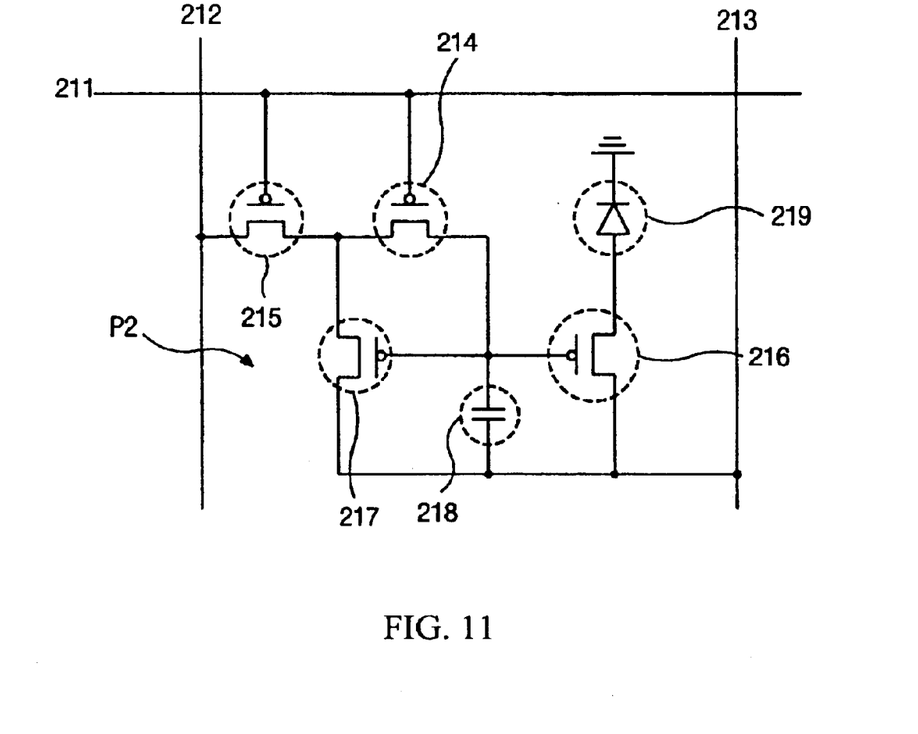
FIG. 11 is a circuit diagram of an active matrix organic electroluminescence display device according to a third embodiment of the present invention.

FIG. 11 is a circuit diagram of an AMOELD device according to a third embodiment of the present invention. In FIG. 11, a gate line 211 and a data line 212 cross each other to define a pixel "P2". The pixel "P2" includes first and second switching TFTs 214 and 215, first and second driving TFTs 216, 217, a storage capacitor 218, and an electroluminescent diode 219.

Gate electrodes of the first and second switching TFTs 214 and 215 are electrically connected to the gate line 211, and a source electrode of the second switching TFT 215 is electrically connected to the data line 212. A drain electrode of the second switching TFT 215 is electrically connected to the source electrode of the first switching TFT 214.

A source electrode of the second driving TFT 217 is electrically connected to the drain electrode of the second switching TFT 215 and the source electrode of the first switching TFT 214. A gate electrode of the second driving TFT 217 is electrically connected to a drain electrode of the first switching TFT 214 and a gate electrode of the first driving TFT 216.

A source electrode of the first driving TFT 216 is electrically connected to a drain electrode of the second driving TFT 217 and a power line 213. A drain electrode of the first driving TFT 216 is electrically connected to an anode electrode of the electroluminescent diode 219. A cathode electrode of the electroluminescent diode 219 is grounded.

One part of the storage capacitor 218 is electrically connected to the drain electrode of the second driving TFT 217 and the source electrode of the first driving TFT 216. The other part of the storage capacitor 218 is electrically connected to the gate electrodes of the first and second driving TFT 216 and 217.

When the first and second switching TFTs 214 and 215 are turned on by a gate signal from the gate line 211, a data signal from the data line 212 is transmitted to the gate electrodes of the first and second driving TFTs 216 and 217. An imaging signal from the power line 213 is transmitted to the electroluminescent diode 219 through the first driving TFT 216 that is turned on by the transmitted data signal, and light is emitted from the electroluminescent diode 219.

Here, a pixel electrode, which is the anode electrode of the electroluminescent diode 219, is made of an opaque conductive material like the first and second embodiments. Moreover, the pixel electrode covers the first and second switching TFTs 214 and 215, the first and second driving TFTs 216 and 217, the storage capacitor 218, and the power line 213. The pixel electrode may overlap the gate line 211 and the data line 212, too.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescence display device, comprising:

a substrate;

a gate line on the substrate;

a data line crossing the gate line;

a power line on the substrate;

a first switching thin film transistor electrically connected to the gate line and the data line;

a first driving thin film transistor electrically connected to the first switching thin film transistor and the power line;

a storage capacitor electrically connected to the first switching thin film transistor, the first driving thin film transistor and the power line; and an electroluminescent diode electrically connected to the first driving thin film transistor, the electroluminescent diode including a first electrode and a second electrode over the first electrode, the first electrode covering the storage capacitor.

2. The device according to claim 1, wherein the first electrode covers the first switching thin film transistor and the first driving thin film transistor.

3. The device according to claim 2, wherein the first electrode covers a portion of the power line.

4. The device according to claim 3, wherein the first electrode overlaps a portion of the gate line and a portion of the data line.

5. The device according to claim 1, wherein the first electrode is made of an opaque conductive material and the second electrode is made of a transparent conductive material.

6. The device according to claim 1, further comprising a second switching thin film transistor and a second driving thin film transistor, the second switching thin film transistor electrically connected to the gate line, the data line and the first switching thin film transistor, the second driving thin film transistor electrically connected to the first switching thin film transistor, the first driving thin film transistor and the storage capacitor.

7. The device according to claim 6, wherein the first electrode covers the first switching thin film transistor and the first driving thin film transistor.

8. The device according to claim 7, wherein the first electrode covers a portion of the power line.

9. The device according to claim 8, wherein the first electrode overlaps a portion of the gate line and a portion of the data line.

10. The device according to claim 6, wherein the first electrode is made of an opaque conductive material and the second electrode is made of a transparent conductive material.

11. An active matrix organic electroluminescence display device, comprising:

a substrate;

a gate line on the substrate;

a data line crossing the gate line;

a power line on the substrate;

a plurality of thin film transistors electrically connected to the gate line and the data line;

a storage capacitor electrically connected to the plurality of thin film transistors and the power line; and an electroluminescent diode electrically connected to the plurality of thin film transistors, the electroluminescent diode including a first electrode and a second electrode over the first electrode, the first electrode covering the storage capacitor.

12. The device according to claim 11, wherein the first electrode covers the plurality of thin film transistors.

13. The device according to claim 12, wherein the first electrode covers a portion of the power line.

14. The device according to claim 13, wherein the first electrode overlaps a portion of the gate line and a portion of the data line.

15. The device according to claim 12, wherein the first electrode is made of an opaque conductive material and the second electrode is made of a transparent conductive material.

16. The device according to claim 15, wherein the plurality of thin film transistors include two thin film transistors.

17. The device according to claim 15, wherein the plurality of thin film transistors include four thin film transistors.

18. The device according to claim 17, wherein two of the thin film transistors are switching thin film transistors having gate electrodes electrically connected to the gate line.

19. The device according to claim 18, wherein two of the thin film transistors are driving thin film transistors having gate electrodes electrically connected to one end of the storage capacitor.

20. The device according to claim 19, wherein one of the driving thin film transistors has a drain electrode electrically connected to another end of the storage capacitor and another of the driving thin film transistors has a source electrode electrically connected to the another end of the storage capacitor and a drain electrode electrically connected to the electroluminescent diode.

* * * * *